United States Patent [19]

Sasaki et al.

[11] Patent Number: 5,364,481
[45] Date of Patent: Nov. 15, 1994

[54] APPARATUS FOR MANUFACTURING A THIN-FILM PHOTOVOLTAIC CONVERSION DEVICE

[75] Inventors: Toshiaki Sasaki; Hitoshi Shimizu, both of Kanagawa, Japan

[73] Assignee: Fuji Electric Co., Ltd., Kawasaki, Japan

[21] Appl. No.: 95,721

[22] Filed: Jul. 21, 1993

[30] Foreign Application Priority Data

| Jul. 24, 1992 | [JP] | Japan | 4-197321 |
| Oct. 23, 1992 | [JP] | Japan | 4-284791 |
| Feb. 4, 1993 | [JP] | Japan | 5-017124 |

[51] Int. Cl.$^5$ .................. C23C 16/50; C23C 16/54
[52] U.S. Cl. .................. 118/718; 118/719; 118/723 E; 118/730; 118/733; 136/249
[58] Field of Search .................. 118/718, 719, 723 E, 118/723 ER, 729, 730, 733; 136/249 TJ

[56] References Cited

U.S. PATENT DOCUMENTS

| 4,423,701 | 1/1984 | Nath et al. | 118/715 |
| 4,483,883 | 11/1984 | Nath et al. | 427/39 |
| 4,513,684 | 4/1985 | Nath et al. | 118/718 |
| 4,574,733 | 3/1986 | Nath et al. | 118/718 |
| 5,000,114 | 3/1991 | Yanagi et al. | 118/718 X |
| 5,180,434 | 1/1993 | DiDio et al. | 118/718 |
| 5,192,585 | 3/1993 | Inokuti et al. | 118/718 X |
| 5,266,116 | 11/1993 | Fujioka et al. | 118/718 |

FOREIGN PATENT DOCUMENTS

| 56-80128 | 6/1981 | Japan . |
| 62-259427 | 11/1987 | Japan . |
| 04299823 | 10/1992 | Japan . |
| 05247655 | 9/1993 | Japan . |
| 2117800 | 10/1983 | United Kingdom . |

OTHER PUBLICATIONS

Technical Digest of the International PVSEC-1, Kobe, Japan "Roll-to-Roll Mass Production Process for a-Si Solar Cell Fabrication" by S. R. Ovshinsky, pp. 577-582.
Technical Digest of the International PVSEC-1, Kobe, Japan "Design of Flexible a-Si: H Solar Cell to Increase conversion Efficiency" by K. Suzuki et al. pp. 191-194.
Technical Digest of the International PVSEC-3, Tokyo, Japan, 1987; "A Monolithic Series-connected a-–Si:H Solar Cell on an Organic Polymer Film" by K. Nakatani et al.; pp. 391-394.

*Primary Examiner*—R. Bruce Breneman
*Assistant Examiner*—Jonathan D. Baskin
*Attorney, Agent, or Firm*—Brumbaugh, Graves, Donohue & Raymond

[57] ABSTRACT

The present invention relates to a method and an apparatus for forming photovoltaic conversion layers and electrode layers with increased efficiency by forming thin film layers under optimal conditions on a belt-like flexible substrate which is transported by means two interacting rollers. Films are formed on the substrate, which remains stationary during film-formation, in film-forming chambers maintained airtight by walls pressed against the substrate via sealing materials. Furthermore, film-forming chamber walls and a ground electrode contacting one side of the substrate are retracted from the substrate surface to facilitate movement of the substrate to a next film-forming position without being damaged. The apparatus of the present invention allows not only the film-forming time and conditions, as well as the size of each film-forming chamber to be controlled independently, but it also prevents intermingling of gases present in different film-forming chambers. In addition, by incorporating a film-forming chamber that can facilitate formation of multi-layered films, or by providing movable film-forming chambers which may be aligned with the substrate, the required time and the size of the apparatus for a device with a multi-layer structure can be shortened.

19 Claims, 8 Drawing Sheets

APPARATUS FOR MANUFACTURING A THIN-FILM PHOTOVOLTAIC CONVERSION DEVICE

BACKGROUND OF THE INVENTION

The present invention relates to a method and an apparatus for manufacturing a thin-film photovoltaic conversion device built on a flexible substrate, such as a solar cell, which can convert light energy into electric energy.

Recently, thin-film photovoltaic conversion devices which use thin-film semiconductors of silicon-based materials, such as amorphous silicon and amorphous silicon alloys, as thin-film photovoltaic conversion devices have attracted attention. Cost reduction through mass production is a significant issue in manufacturing solar cells, which are representative of thin-film photovoltaic conversion devices, and, naturally, enhancement of production quantity per unit time is always a key objective. Conventional rigid glass plates and stainless steel sheets generally used for the substrates of thin-film photovoltaic conversion devices make the process of loading and unloading the substrates to a vacuum device complex, and also complicate their mounting on, and removal from, substrate holders.

In search of ways to reduce the manufacturing time, much has been expected from devices which use resin or similar materials for substrates because of their potential for reducing the substrate cost and making it easier to use solar cells. For these reasons, a "roll-to-roll" system has been developed, in which a belt-shaped flexible substrate in the form of a roll is placed in a loading chamber, and a thin-film photovoltaic conversion device with a multi-layer construction is repeatedly formed on the belt-shaped substrate as the substrate passes through various reaction chambers. Such a system is disclosed by K. Suzuki et al. in the "Technical Digest of the International PVSEC-1" (1984), p. 191, or by S. R. Ovshinsky et al. in the "Technical Digest of the International PVSEC-1" (1984), p. 577, for example.

Figure 2:
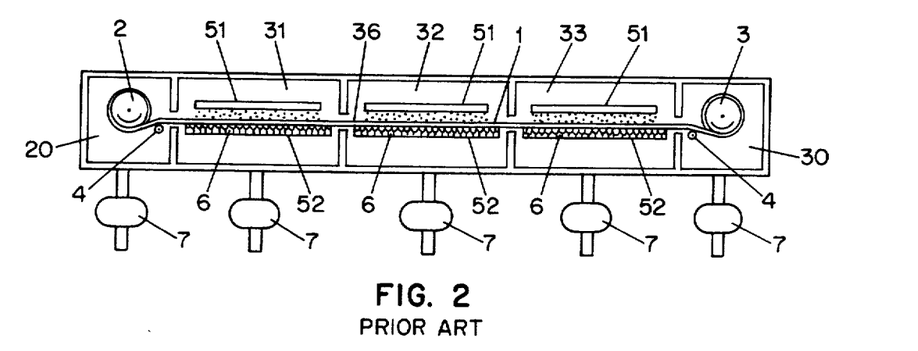
FIG. 2 is a cross-sectional view along the length of a conventional film-forming apparatus.

FIG. 2 shows a conventional film-forming apparatus that can form a photovoltaic conversion layer having a pin construction. A belt-shaped flexible substrate (1) unrolled from a loading roller (2) in a loading chamber (20) passes a transporting roller (4) and goes into a loading chamber (30) where it is continuously wound around an unloading roller (3). When the substrate is positioned within a p-layer forming chamber (31), a two-layer is formed on the surface of the flexible substrate (1) as a result of a reaction in which gas is decomposed by plasma generated between a high-voltage electrode (51) and an earth electrode (52) disposed with a substrate heater (6). Similarly, an i-layer and an n-layer are formed when the substrate passes an i-layer forming chamber (32) and an n-layer forming chamber (33), respectively. Exhaust systems (7) are connected to the loading chamber (20), each reaction chamber (31), (32) and (33), and the unloading chamber (30).

Figure 3:
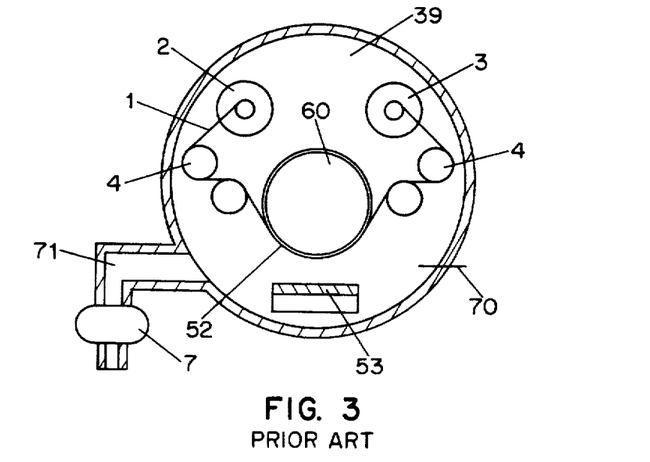
FIG. 3 is a cross-sectional view of a sputtering, or spraying, apparatus used to form conventional electrode layers.

Typically, electrode layers, one of which is a transparent electrode layer, are disposed on both sides of a photovoltaic conversion layer having a pin construction. To form such electrode layers, which are conductive layers, a film-forming apparatus as shown in FIG. 3 is used. The belt-shaped flexible substrate (1) unrolled from the loading roller (2) in a film-forming chamber (39), which is connected with an exhaust tube (71) and a gas-introducing tube (70), passes the transporting roller (4) and a heating roller (60) where it is continuously wound round the unloading roller (3). Because the face of a target (53), which is made of a conductive material, is exposed to plasma generated between the target (53) and the earth electrode (52) disposed on the heating roller (60), a conductive layer is formed on the substrate surface when the substrate (1) passes the heating roller (60).

Figure 4:
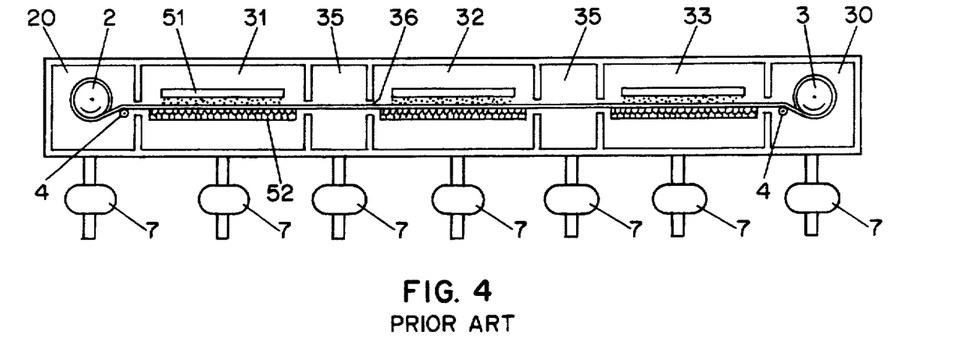
FIG. 4 is a cross-sectional view along the length of another conventional film-forming apparatus.

Several drawbacks exist in a film-forming device shown in FIG. 2. As a result of the flexible substrate (1) passing continuously through the reaction chambers (31), (32) and (33), air-tightness cannot be maintained sufficiently at the partition (36) separating the reaction chambers. As a result, gases from the adjacent reaction chambers intermingle. Moreover, the substrate (1) and films thereon may be damaged by friction with the partition (36) and the earth electrode (52). In addition, because the reaction chambers must be maintained at the same pressure, individual chambers cannot be controlled independently to assure the optimal pressure required for a desired film quality. Installing a preliminary chamber (35) as shown in FIG. 4, which is maintained at a low pressure via an independent exhaust system (7), between the reaction chambers (31) and (32), and also between the reaction chambers (32) and (33), may partially correct the gas-permeating problem and the pressure dependence of each reaction chamber, but the problem of substrate damage is not corrected.

Figure 5:
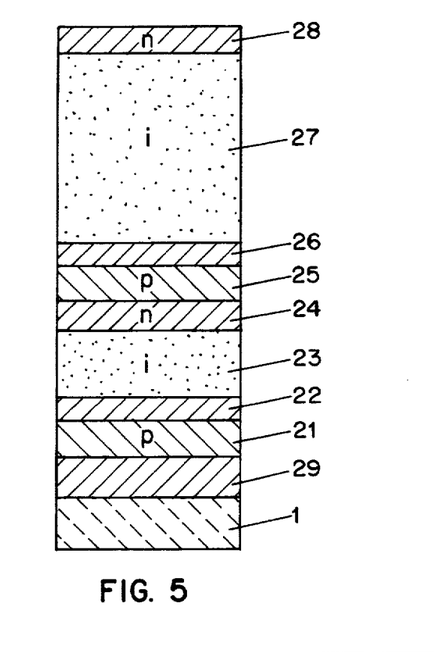
FIG. 5 is a cross-sectional view showing various layers of a multi-layer structure solar cell manufactured according to the present invention.

FIG. 5 shows a multi-layer construction designed to improve the conversion efficiency in thin-film solar cells, which structure consists of ten layers. The bottom layer, the substrate (1), is covered with an electrode layer (29). Disposed on top of the layer (29) is a p-layer (21) having a thickness of 100 Å to 200 Å and consisting of amorphous silicon-carbon alloy (a-SiC) or amorphous silicon-oxygen alloy (a-SiO). Next, a buffer layer (22) having a thickness of 100 Å to 200 Å and consisting of amorphous silicon (a-Si), a-SiC or a-SiO is disposed on top of the layer (21). Disposed on top of the layer (22) in ascending sequential order are: an i-layer (23) having a thickness of 700 Å and consisting of a-Si; an n-layer (24) having a thickness of 300 Å and consisting of a-Si; a p-layer (25) having a thickness of 100 Å to 200 Å and consisting of a-SiC or a-SiO; a buffer layer (26) having a thickness of 100 Å to 200 Å and consisting of a-Si, a-SiC or a-SiO; an i-layer (27) having a thickness of 3,000 Å and consisting of a-Si; and an n-layer (28) having a thickness of 300 Å and consisting of a-Si.

Figure 6:
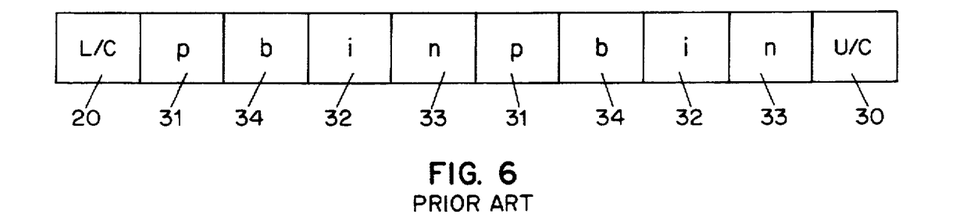
FIG. 6 is a block diagram of a conventional film-forming apparatus used to manufacture the solar cell in FIG. 5.

Photovoltaic conversion devices having a multi-layer construction shown in FIG. 5 may be manufactured by using a conventional film-forming apparatus shown in FIG. 6. The apparatus has two sets of p-layer forming chambers (31), a buffer layer-forming chamber (34), an i-layer forming chamber (32), and an n-layer forming chamber (33) arranged between the loading chamber (20) and the unloading chamber (30). The apparatus shown in FIG. 6 has several major drawbacks, one of which is that, as the number of chambers traversed by the substrate increases, severity of the substrate damage increases. In addition, because the substrate travels through the film-forming chambers at a constant speed, either the lengths of the chambers must be designed to match the film-forming speeds of each film, or the film-forming speed must be adjusted in order to build a multi-layer structure having film-layers of varying film thicknesses and film-forming speeds.

If the lengths of the chambers are made dependent on the film-forming speeds, no degree of freedom can be given to the size of the apparatus, and no adjustments are possible after the apparatus is designed. If one chooses the option of adjusting the film-forming speeds, optimal film-forming speed for a given type of film may not be selected. For instance, if the n-layer (24) or (28) with a thickness of 300 Å is formed in the film-forming chamber (33) in one stage while the i-layer (27) with a thickness of 3,000 Å is formed in the film-forming chamber (32) in a subsequent stage, the relative lengths of the film-forming chambers must have a ratio of 1:10, or the film-forming speed must be set to 1/10, something which is extremely difficult to realize.

It is an object of the present invention to provide an improved method for manufacturing a thin-film photovoltaic conversion device.

It is another objective of the present invention to provide an improved apparatus for manufacturing a thin-film photovoltaic conversion device.

It is another object of the present invention to provide an improved method for manufacturing a thin-film photovoltaic conversion device, which method facilitates formation of films in each layer of the device under optimal pressures.

It is another objective of the present invention to provide an improved apparatus for manufacturing a thin-film photovoltaic conversion device, which apparatus forms films in each layer of the device under optimal pressures.

It is another object of the present invention to provide an improved method for manufacturing a thin-film photovoltaic conversion device, which method will not damage the flexible substrate being formed.

It is another object of the present invention to provide an improved apparatus for manufacturing a thin-film photovoltaic conversion device, which apparatus will not damage the flexible substrate being formed.

It is another object of the present invention to provide an improved method for manufacturing a thin-film photovoltaic conversion device, which method will allow a greater degree of freedom in selecting the size of the apparatus and the film-forming speed of each layer of the conversion device.

It is another object of the present invention to provide an improved apparatus for manufacturing a thin-film photovoltaic conversion device, which apparatus will allow a greater degree of freedom in selecting the size of the apparatus and the film-forming speed of each layer of the conversion device.

SUMMARY OF THE INVENTION

In order to achieve the above objectives, the present invention utilizes a method of manufacturing a thin film photovoltaic conversion device which involves forming a photovoltaic conversion layer by laminating a plurality of thin films having different characteristics on a belt-shaped flexible substrate, wherein the flexible substrate is passed through various film-forming chambers arranged in sequence. A given layer of film is formed on the substrate while it remains stationary in a predetermined airtight atmosphere in a given film-forming chamber. Each chamber is maintained airtight by walls that contact the substrate at the entrance to the given film-forming chamber via a sealing material. After the formation of a given layer of film, the substrate is transported to a next film-forming position at which a different film layer is formed.

In a preferred method according to the invention, it is desirable to form electrode layers in succeeding film-forming chambers after a photovoltaic conversion layer has been formed. In addition, all of the film-forming chambers may be arranged in one collective vacuum chamber with preliminary chambers arranged between the film-forming chambers, each film-forming chamber and preliminary chamber being in vacuum condition. Furthermore, it is desirable to form the film-layers with the substrate face in a vertical plane. This arrangement reduces contamination of the substrate or the film face which can result from dust generated from the walls and ceilings of the film-forming chambers.

In a preferred embodiment of the present invention, film layers are formed by applying a voltage between the electrodes, one which contacts the substrate in the film-forming chambers and another which is positioned opposite the film-forming surface of the substrate. The electrodes that contact the substrate during film formation are retracted from the substrate surface during substrate movement. It is preferable to use a substrate that is a metal film, or a resin film having one side coated with a conductive film, or a metal film having one side coated with a conductive film via an insulation film.

The present invention also encompasses an apparatus for manufacturing thin-film photovoltaic conversion devices having a photovoltaic conversion layer by laminating a plurality of thin films having different characteristics on a belt-shaped flexible substrate. A preferred embodiment of the apparatus has a plurality of film-forming chambers through which the flexible substrate passes. This embodiment of the apparatus has rollers arranged at both ends of the length of a collective vacuum chamber encompassing the film-forming chambers, such that the substrate can be unrolled from one of the rollers and wound around the other roller in the collective vacuum chamber. Each film-forming chamber is partitioned by walls which contact the substrate at the entrance to the chamber via a sealing material associated with the chamber walls. In order to facilitate movement of the substrate, the sealing material on the walls of the film-forming chambers is designed to be retracted from the substrate surface during the substrate movement. Additionally, the collective vacuum chamber and the film-forming chambers are connected to individual exhaust systems.

As an alternative embodiment, rollers are arranged at one end of a loading chamber and at one end of an unloading chamber. The flexible substrate is unrolled from the rollers in the loading chamber, passes through the film-forming chambers and is wound around the rollers in the unloading chamber. A preliminary chamber is located between each of the two immediately adjacent film-forming chambers, and all of the preliminary chambers and the film-forming chambers are arranged on one line. Each film-forming chamber is partitioned from the adjacent chamber by walls that contact the substrate at the entrance to the chamber via a sealing material. During the substrate transport, the sealing material associated with the walls of the film-forming chambers is retracted away from the substrate surface. The loading chamber, the unloading chamber, the film-forming chambers and the preliminary chambers are each connected to individual exhaust systems.

Another variation of the present invention is achieved by incorporating select film-forming chambers which can be made to move perpendicular to the substrate's travelling direction. In an embodiment incorporating this structure, two film-forming chambers are vertically stacked, perpendicular to the direction of the substrate movement, and the substrate passes through only one of the movable chambers, i.e., whichever movable chamber is in line with the plane of the substrate surface. Upon completion of film formation in one of the vertically-stacked chambers, the other vertically-stacked chamber may utilized to form a film of a different type. This arrangement allows a more effective utilization of each film-forming chamber, making it possible to increase production per unit time and reduce the number of film-forming chambers required.

In a preferred embodiment of the apparatus according to the present invention, a first electrode is provided in each film-forming chamber, which electrode contacts the substrate during actual film-layer formation and which repositions itself to a location away from the substrate surface during the substrate transport. In addition, a second electrode is placed opposite said first electrode in each film-forming chamber, such that the substrate is located between the first and second electrodes. It is also desirable to arrange the shafts of the rollers perpendicular to the first and second electrodes' flat surfaces.

The present invention allows formation of film layers on a flexible substrate in airtight film-forming chambers. The stationary substrate and the sealing material associated with the film-forming chamber walls interact to maintain the film-forming chambers airtight during film formation. Furthermore, placing each film-forming chamber in a collective vacuum chamber, or installing preliminary chambers or loading and unloading chambers adjoining each film-forming chamber, prevents contamination of the individual film-forming chambers by gases from external sources or gases found in other film-forming chambers. The present invention also allows independent pressure control of each film-forming chamber and formation of films under optimal pressure conditions. In addition, because the sealing material associated with the film-forming chamber walls which keeps the film-forming chambers airtight during film formation, as well as the electrode that contacts the substrate during the actual film formation stage, detaches from the substrate when the flexible substrate is being transported, the substrate and films thereon are not damaged.

Additional benefits results from forming films on a substrate which remains stationary during film formation. It is possible to form films in each film-forming chamber over different time periods, and it is possible to set the lengths of the film-forming chambers as a function of desired characteristics of a given layer. In these cases, the time interval between substrate movements is determined by the longest time required to form a film layer in each film-forming chamber. In order to shorten this time interval, a thick layer may be formed by repeating the film-forming processes in varied positions in a longer film-forming chamber while a plurality of thinner layers are formed in other film-forming chambers. Furthermore, it is possible to laminate a plurality of different layers by changing the reaction gases in film-forming chambers for thinner films, while the thicker layer is formed in one film-forming chamber.

In addition, if the substrate is wound around a roller after an electrode layer is formed on top of the photovoltaic conversion layer in a succeeding film-forming chamber, the electrode layer can reinforce and protect the photovoltaic conversion layer. For example, a weak Si—Si bond in the a-Si photovoltaic conversion layer can be protected against potential breakage resulting from stress generated during the winding of the photovoltaic conversion layer onto the roller. This method can also prevent deterioration of the photovoltaic conversion layer caused by moisture contained in the atmosphere and generation of pinholes in the photovoltaic conversion layer resulting from thermal shrinkage of the substrate occurring when it is wound around the roller.

DETAILED DESCRIPTION OF THE EMBODIMENTS

Figure 1:
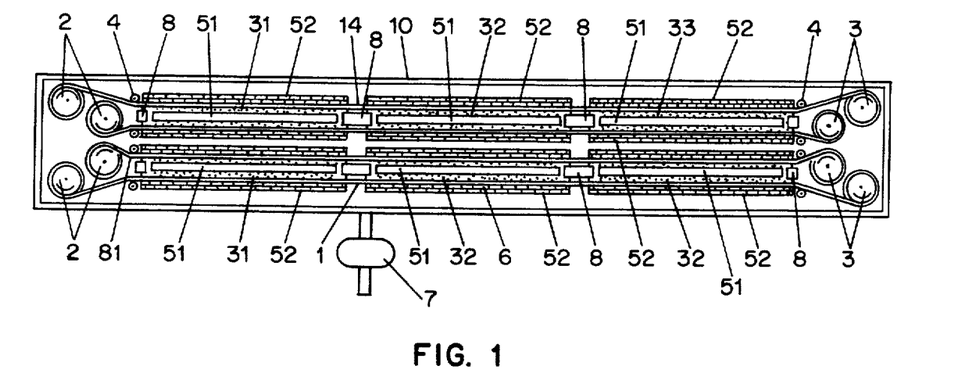
FIG. 1 is a cross-sectional view along the length of a film-forming apparatus according to one embodiment of the present invention.

A first preferred embodiment of the present invention, a stepping-roller-type film-forming apparatus, is shown in FIG. 1. In this embodiment, a flexible substrate (1) in a form of a flat belt is wound around a loading roller (2) located in an elongated vacuum chamber (10) equipped with an exhaust system (7). The substrate (1) is moved by a transport roller (4) and is wound round an unloading roller (3) after passing through several reaction chambers, namely a p-layer forming chamber (31), an i-layer forming chamber (32), and an n-layer forming chamber (33).

Each of the reaction chambers (31), (32) and (33) is comprised of two reaction systems through which the flexible substrate passes. Each of the reaction, or film-forming, chambers (31), (32) and (33), in each of which a thin a-Si type film is formed via a plasma CVD process, has a high-voltage electrode (51) arranged opposite a ground electrode (52) coupled to a substrate heater (6). Both electrodes (51) and (52) are arranged parallel to the surface plane of the substrate and are separated by the substrate. The a-Si type film is formed within a given film-forming chamber while the flexible substrate (1) remains stationary.

The ground electrode (52) and reaction chamber walls (8), which are disposed with sealing materials (81), firmly contact the stationary substrate (1) on both of its surfaces, thereby maintaining the reaction chambers (31), (32) and (33) airtight. This airtight environment enables individual exhaust systems connected to each reaction chamber, which exhaust systems are not shown for sake of clarity, to control the pressure and film-forming conditions of each chamber independently. Furthermore, by controlling the pressure in the vacuum chamber (10), via the exhaust system (7), lower than the pressures in the individual reaction chambers, intermingling of reaction gases from different reaction chambers, or ingress of air from other chambers into the individual reaction chambers (31), (32) and (33), is prevented.

Upon completion of formation of a given film layer, when no voltage is being applied to the electrodes in each reaction chamber, a vacuum is created in each reaction chamber, and the substrate is transported to another position at which it can form the next layer. During the substrate movement, the ground electrode (52) and the sealing materials (81) on the reaction chamber walls (8) are retracted from contact with the substrate.

The flat-surface plane of the substrate, each shaft of the loading roller (2), the unloading roller (3) and the transporting roller (4), and flat-surface plane of the high-voltage electrode (51) and the ground electrode (52), are all arranged vertically, thereby preventing dust dropping from the ceilings and the walls in the reaction chambers (31), (32) and (33) from depositing on the substrate or the film. Of course, alternatively, the flat-surface plane of the substrate (1) may be laid horizontally.

Using the preferred embodiment of the apparatus shown in FIG. 1, which can simultaneously form films on four separate flexible substrates, facilitates significant increases in productivity over the conventional apparatuses. In addition, since films are formed on two substrates passing through one reaction chamber, the material gas can be used more efficiently and the apparatus can be made more compact.

Figure 7A:
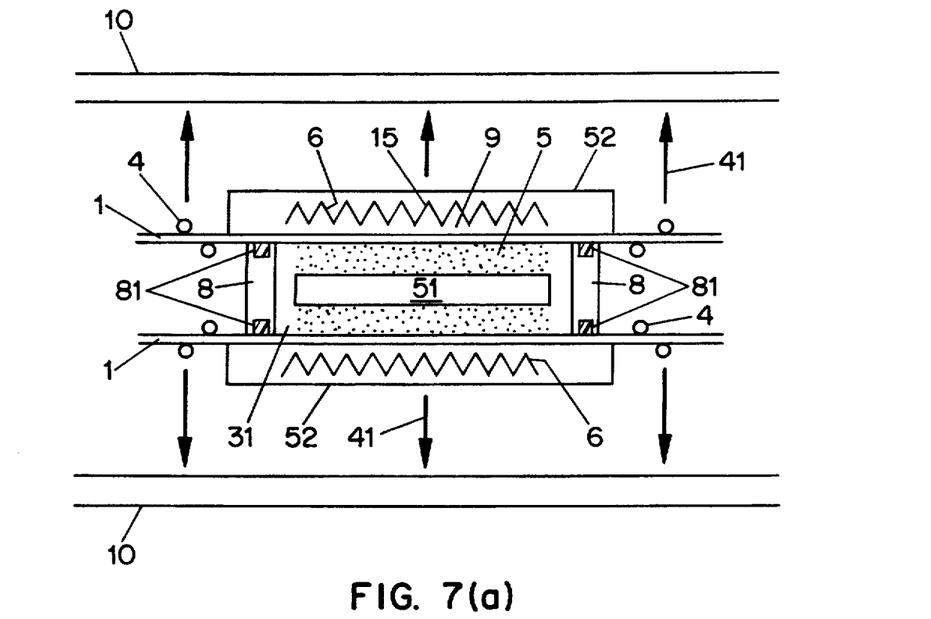
FIG. 7(a) shows a horizontal cross section of a substrate support and transport mechanism in one embodiment of the apparatus according to the present invention, along with an illustration of film formation of one layer.
Figure 7B:
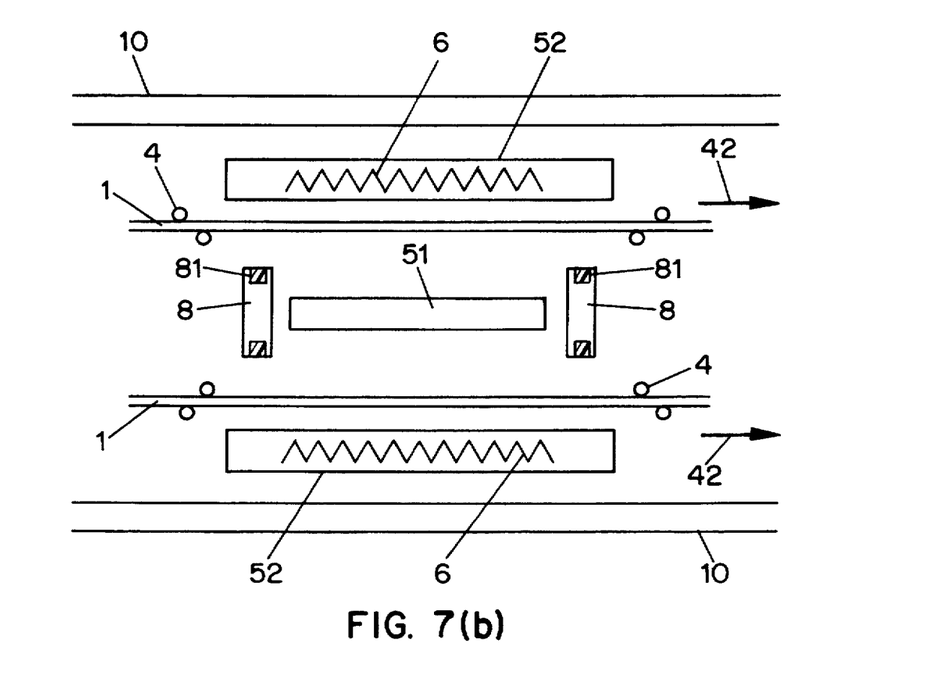
FIG. 7(b) shows a horizontal cross section of a substrate support and transport mechanism in one embodiment of the apparatus according to the present invention, along with an illustration of the substrate movement.

FIGS. 7(a) and 7(b) show a second preferred embodiment of the film-forming apparatus that supports and transports flexible substrates. As shown in FIG. 7(a), which depicts a film formation process within the film-forming apparatus, the ground electrodes (52) firmly press against a first side of the substrate (1), which is additionally sandwiched by transporting rollers (4), and sealing materials (81) located on the reaction chamber walls (8) presses against a second side of the substrate. As a result, the reaction chamber (31) is kept airtight, and plasma (5) is generated by the voltage applied across the electrodes (51) and (52).

Prior to the flexible substrates' (1) being moved, the transporting rollers (4), along with the substrates (1), are moved about 1 cm away from the chamber walls (8), and the ground electrodes (52) are moved about 2 cm from the chamber walls (8) such that 1 cm clearance exists between the ground electrodes (52) and the substrates. These movements are indicated by the arrow marks (41) in FIG. 7(a). FIG. 7(b) shows the condition that exists following these movements, at which time the substrates (1) can be transported in the direction indicated by the arrow marks (42) without contacting the reaction chamber walls (8) and the ground electrodes (52).

Figure 8A:
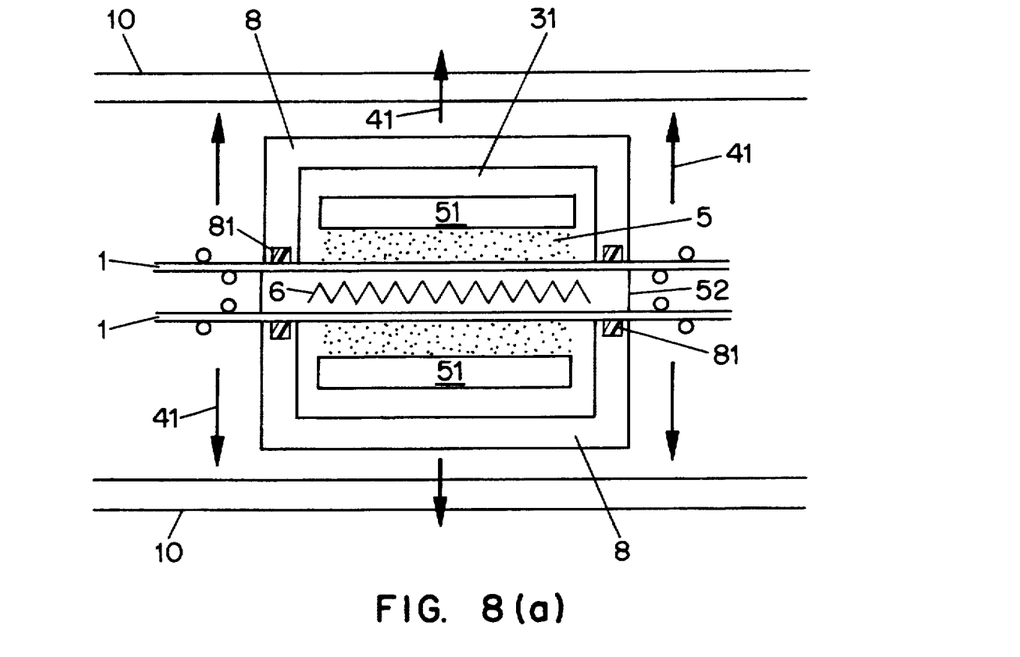
FIG. 8(a) shows a horizontal cross section of a substrate support and transport mechanism in another embodiment of the apparatus according to the present invention, along with an illustration of film formation of one layer.
Figure 8B:
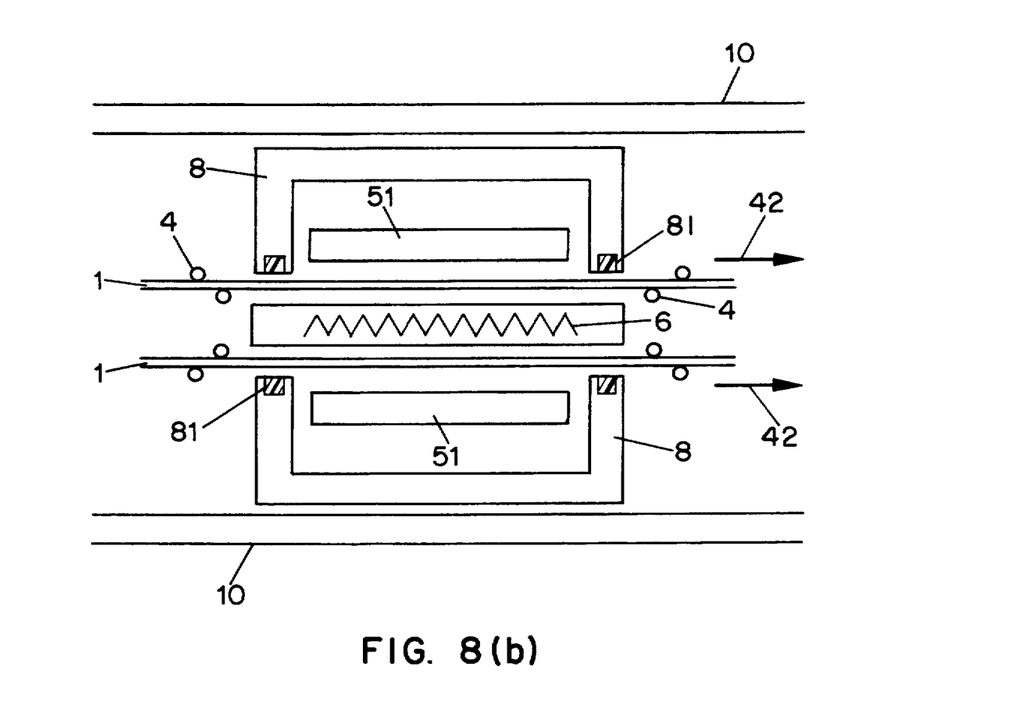
FIG. 8(b) shows a horizontal cross section of a substrate support and transport mechanism in another embodiment of the apparatus according to the present invention, along with an illustration of the substrate movement.

FIGS. 8(a) and 8(b) show a third preferred embodiment of the film-forming apparatus that supports and transports flexible substrates. In this embodiment, unlike the embodiments shown in FIGS. 1 and 7, two high-voltage electrodes (51) and one ground electrode (52) are disposed for a set of two flexible substrates. Upon completion of film formation of a given film layer, the reaction chamber walls (8), which have a U-shaped cross section, and the transporting rollers (4) are retracted away from the ground electrode (52) in the direction indicated by the arrow marks (41). This movement creates unobstructed pathways for movement of the substrates (1), which are then transported in the direction indicated by the arrow marks (42) in FIG. 8(b).

Figure 9:
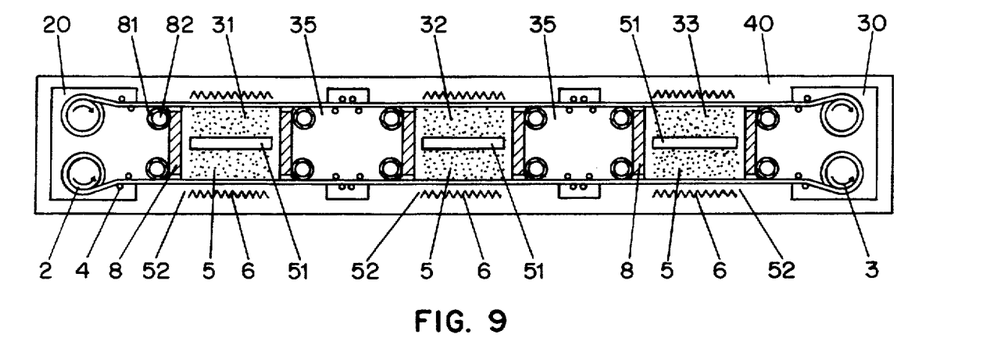
FIG. 9 shows a horizontal cross section of a film-forming apparatus according to yet another embodiment of the present invention.

FIG. 9 shows a fourth preferred embodiment of the present invention, which does not incorporated the collective vacuum chamber (10). In this embodiment, the reaction chambers (31), (32) and (33) are not located adjacent to each other. Rather, a preliminary chamber (35) is disposed between any two immediately adjacent reaction chambers. Furthermore, a loading chamber (20) is located outside the p-layer forming chamber (31), and an unloading chamber (30) is located outside the n-layer forming chamber (33). All of the aforementioned chambers shown in FIG. 9 share a common outer wall (40).

In the embodiment of FIG. 9, independent exhaust systems, which are not shown for sake of clarity, are connected to each of the reaction chambers (31), (32) and (33), the preliminary chambers (35), the loading chamber (20) and the unloading chamber (30). Each of these chambers has independent vacuum control. As a result, these exhaust systems can be made more compact and the quality of the vacuum can be improved. Moreover, by controlling the pressures in the preliminary chambers (35), the loading chamber (20) and the unloading chamber (30) below the pressures in the reaction chambers (31), (32) and (33), intermingling of reaction gases from different reaction chambers or the ingress of air into each reaction chamber can be prevented.

Figure 10:
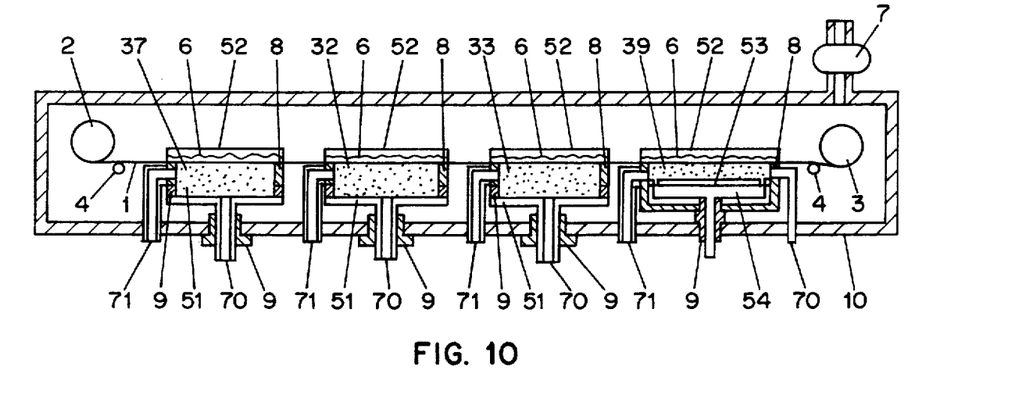
FIG. 10 shows a horizontal cross section of a film-forming apparatus according to yet another embodiment of the present invention.

A fifth preferred embodiment of the apparatus according to the present invention, shown in FIG. 10, incorporates four film-forming chambers (31), (32), (33) and (39) arranged in the collective vacuum chamber (10). By using the apparatus shown in FIG. 10, electrically conductive layers, which are normally formed via conventional film-forming devices, can be continually formed on top of previously formed photovoltaic conversion layers without coming into contact with the air. No preliminary chambers (35) are provided in this device, and the belt-form flexible substrate (1) passes through the confines of the collective vacuum chamber (10) located between two adjacent film-forming chambers.

In FIG. 10, each of the film-forming chambers (31), (32) and (33) is comprised of a high-voltage electrode (51) connected to a gas supply tube (70), a ground electrode (52) having a substrate heater (6) located opposite the high-voltage electrode, and film-forming chamber walls (8) insulated from the high-voltage electrode (51) by an insulator (9). Each chamber defines a sealed space connected through an exhaust tube (71) to an exhaust system, which is not shown for sake of clarity. The substrate (1) is sandwiched between the film-forming chamber walls (8), which contacts the substrate either directly or via a sealing material, and the ground electrode (52). The film-forming chamber (39) is defined by a ground electrode (52) having a substrate heater (6) and film-forming chamber walls (8), and the gas supply tube (70) and the exhaust tube (71) are connected to the chamber (39). Within the chamber (39), a target (53) supported on a packing plate (54) and the film-forming chamber walls (8) are insulated from the high-voltage electrode (51) by the insulator (9).

In order to form the electrode layers, a vacuum is created in this film-forming chamber (39) via the exhaust tube (71), and the chamber (39) is supplied with sputter gas through the gas supply tube (70). While maintaining a predetermined film-forming pressure within the chamber (39), voltage is applied to the target (53) to sputter the face of the target (53) with plasma resulting from electro-chemical reaction, whereby electrode layers are formed on top of photovoltaic conversion layers formed in the reaction chambers (31), (32) and (33). Thereafter, ground electrodes (52) are moved away from the substrate and the film-forming chamber walls (8) so that the substrates (1) can be transported without contacting the ground electrodes and the chamber walls.

Figure 11:
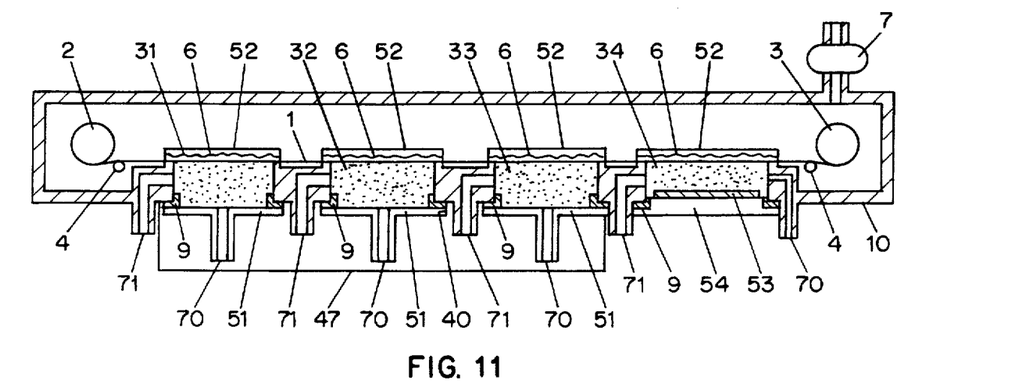
FIG. 11 shows a horizontal cross section of a film-forming apparatus according to another embodiment of the present invention.

In a sixth embodiment of the film-forming apparatus according to the present invention, shown in FIG. 11, part of the wall of the collective vacuum chamber (10) forms an outer wall (40) common to the film-forming chambers (31), (32), (33) and (34), and the exhaust tubes (71) protrudes through the common outer wall (40). The packing plate (54), which anchors the target (53), and the high-voltage electrodes (51) have their outer surfaces directly contacting the air. Although no discharge in the air results from the voltage applied to the high-voltage electrode (51) and the packing plate (54) in this apparatus, the high-voltage electrode (51) is covered with a shielding plate (47) to prevent the emission of electromagnetic waves. This embodiment facilitates greatly simplified maintenance, such as cleaning the interiors of each film-forming chamber and replacing the ground electrode (52) or the target (53), by arranging the high-voltage electrode (51) and the packing plate (54) in such a way that they can be removed easily.

Figure 12A:
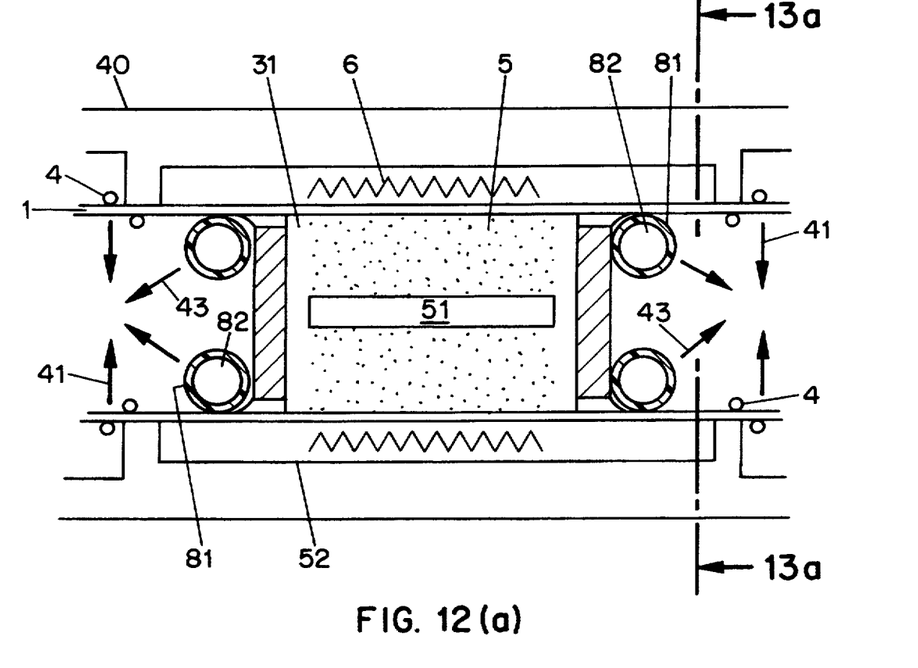
FIG. 12(a) shows a horizontal cross section of a substrate support and transport mechanism in the film-forming apparatus shown in FIG. 9, along with an illustration of film formation of one layer.
Figure 12B:
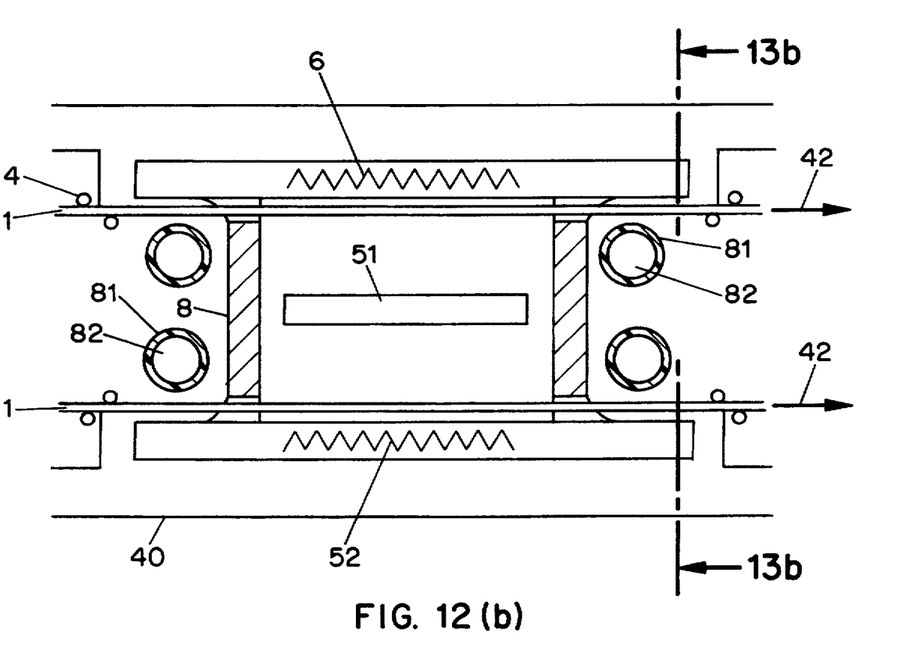
FIG. 12(b) shows a horizontal cross section of a substrate support and transport mechanism in the film-forming apparatus shown in FIG. 9, along with an illustration of the substrate movement.
Figure 13A:
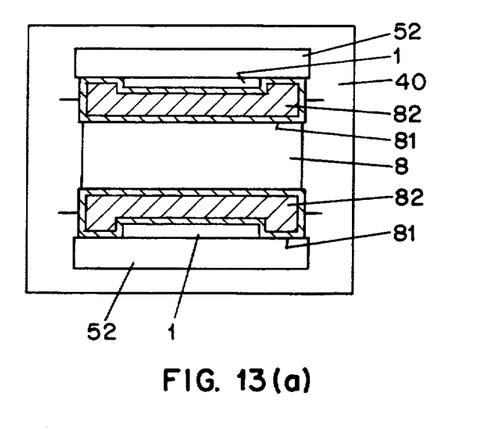
FIG. 13(a) shows a cross section taken along the line A—A in FIG. 12 (a).
Figure 13B:
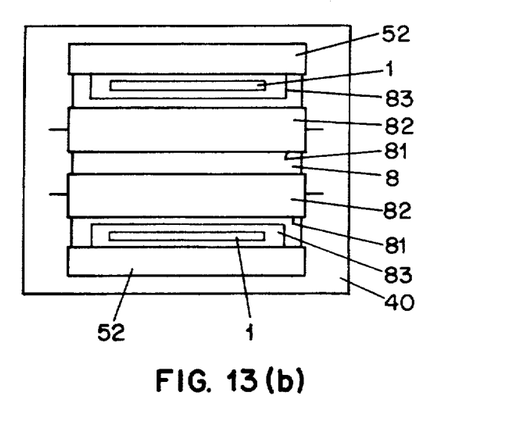
FIG. 13(b) shows a cross section taken along the line A—A in FIG. 12(b).

FIGS. 12(a) and 12(b) and FIGS. 13(a) and 13(b) show cross sections of an alternative mechanism that may be used to support and transport flexible substrates in the aforementioned preferred embodiments of the film-forming apparatus. FIGS. 12(a) and 12(b) show a cross section along the length of the film-forming apparatus. FIGS. 13(a) and 13(b) show cross sections along the width of the film-forming apparatus at lines A—A in FIGS. 12(a) and 12(b), respectively. When the substrates are being transported, the transporting rollers are moved in the directions indicated by the arrow marks (41), while the sealing rollers (82) covered with the sealing materials (81) are also moved in the directions indicated by the arrow marks (43) in FIG. 12(a), thereby effectively retracting the sealing materials from the reaction chamber walls (8) and the substrates (1). This makes it possible, as shown in FIG. 12(b) and FIG. 13(b), to transport the substrates (1) through substrate-transport openings (83) at the edges of the reaction chamber walls (8). The edges of the reaction chamber walls (8) are curved in order to allow the sealing rollers (82) to broadly contact the walls.

While the mechanism shown in FIGS. 12(a), 12(b), 13(a) and 13(b) uses column-like sealing rollers, sealing members having cross sections in the shape of a right triangle, a rectangle or an arc may be used, provided sufficient sealing between the flexible substrate (1) and the reaction chamber wall (8) is assured. The flexible substrate support and transportation mechanisms described above can be incorporated in the film-forming apparatus shown in FIGS. 1 and 7–11.

FIG. 5 shows a multi-layer solar cell which is manufactured by using a conventional film-forming apparatus that has not only the three reaction chambers (31), (32) and (33), but also two p-layer forming chambers (31), two buffer layer forming chambers (34), two i-layer forming chambers (32), and two n-layer forming chambers (33), which conventional apparatus is shown in FIG. 6. When using such a conventional apparatus to form the device shown in FIG. 5, initially a gas mixture of 10% $SiH_4$ and $H_2$ is injected at a flow rate of 1,000 Sccm, $C_2H_2$ at 5 Sccm, and $B_2H_6$ at 1 Sccm into a first p-layer forming chamber encompassing a portion of the flexible substrate (1). As a result of this gas injection, a translucent electrode layer (29) is formed on the surface of a section of the substrate (1), which has been unrolled from a roller in the loading chamber (20) and remains stationary during the film formation stage.

Next, a p-layer (21) with a film thickness of 100 Å is formed in one minute under a pressure of 1.0 Torr at a power density of 100 $mW/cm^2$, resulting in a film-forming rate of 100 Å/min. On top of the layer (21), a buffer layer (22) is formed to a thickness of 100 Å in 1.3 minutes under a pressure of 1.0 Torr and a power density of 100 $mW/cm^2$ by moving the substrate section that has been formed with the p-layer (21) into a second buffer-layer-forming chamber (34), into which (10% $SiH_4+H_2$) gas is injected at a flow rate of 1,000 Sccm while $C_2H_2$ is injected at a rate of 5 Sccm, resulting in a film-forming rate of 80 Å/min.

On top of the layer (22), an i-layer (23) is formed to a thickness of 600 Å in 3 minutes under a pressure of 0.5 Torr and a power density of 100 $mW/cm^2$ by moving the substrate section formed with the p-layer (21) and the buffer layer (22) into the first i-layer forming chamber (32), into which 100% $SiH_4$ gas is injected at a flow rate of 1,000 Sccm, resulting in a film-forming rate of 150 Å/min. Thereafter, on top of the layer (23), an n-layer (24) is formed to a thickness of 300 Å in 2.5 minutes under a pressure of 1.0 Torr and a power density of 100 mW/cm2 by moving the substrate section formed with the p-layer (21), the buffer layer (22) and the i-layer (23) into the first i-layer forming chamber (32), into which (10% $SiH_4+H_2$) gas is injected at a flow rate of 1,000 Sccm while $PH_3$ is injected at a rate of 4 Sccm, resulting in a film-forming rate of 120 Å/min.

Next, on top of the layer (24), in structurally ascending sequence, a p-layer (25), a buffer layer (26), an i-layer (27) and an n-layer (28) are similarly formed in the second p-layer forming chamber (31), the buffer layer forming chamber (34), the i-layer forming chamber (32) and the n-layer forming chamber (33), respectively.

The film-forming conditions in all the chambers of the conventional apparatus shown in FIG. 6 are uniform, namely identical to those of the first film-forming chamber. However, because the desired thickness of the i-layer (27) is 3,000 Å, the required film-forming time for the i-layer (27) is 20 minutes. As mentioned previously, the time interval between individual substrate movements is determined by the longest time required to form a film layer in any one of the film-forming chambers, which, in this case, is 20 minutes. Consequently, the flexible substrate (1) must remain stationary for a minimum of 20 minutes in any given film-forming chamber, at the end of which time period the substrate is moved to the next chamber in which different film segments are formed.

Figures 14, 15A:
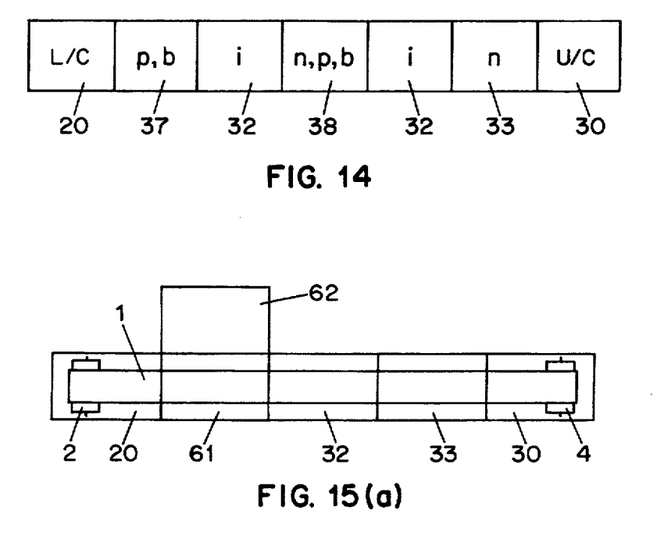
FIG. 14 is a block diagram of a film-forming apparatus according to one embodiment of the present invention used to manufacture the solar cells shown in FIG. 5.
FIGS. 15(a) shows a vertical cross section of a film-forming apparatus according to still another embodiment of the present invention, along with an illustration of a first step in a film-forming method utilizing the apparatus.

FIG. 14 shows an arrangement of the reaction chambers in an embodiment of the film-forming apparatus according to the present invention which facilitates significantly shorter time intervals required between individual substrate movements. According to this embodiment, the apparatus is made more compact by incorporating a film-forming chamber (37) that serves as both a p-layer forming chamber and a buffer-layer-forming chamber, and a film-forming chamber (38) that simultaneously serves as a p-layer forming chamber, a buffer-layer-forming chamber and an n-layer forming chamber. Since the film-forming time in the i-layer forming chamber (32) is longer than that in the other reaction chambers, other multiple layers can be formed while the i-layer is being formed, which means that the total time required to form the multiple layers can be reduced.

If manufacturing the solar cells shown in FIG. 5 with the embodiment having the film-forming-chambers arrangement of FIG. 14, the time required to form films in the film-forming chamber (37) is 2.3 minutes exclusive of the time required to change the gas, and the film-forming time in the film-forming chamber (38) is 4.8 minutes exclusive of the time required to change the gas. This means that the film-forming operation can be completed well within 20 minutes, during which time the i-layer (27) is formed.

Alternatively, in order to reduce the required film-forming time, it is also effective to increase the length of the i-layer forming chamber by integer multiples of lengths of the other chambers. With an apparatus of this configuration, the flexible substrates are moved intermittently and the i-layer forming operation is repeated two or more times.

FIGS. 15(a) through 15(d) show vertical cross sections taken along the length of an embodiment of the film-forming apparatus according to the present invention, which apparatus and the operating methods thereof can reduce the required number of film-forming chambers from five in the apparatus shown in FIG. 11 to four, and reduce the required number of substrate movements from five to three. This apparatus has movable film-forming chambers (61) and (62), an i-layer forming chamber (32) and an n-layer forming chamber (33) disposed between the loading chamber (20) and the unloading chamber (30). The movable film-forming chambers (61) and (62) move perpendicularly in relation to the direction of substrate movement, and the flexible substrate can pass through only one of these two chambers, i.e., whichever one is aligned with the path of the substrate movement.

Figure 15B:
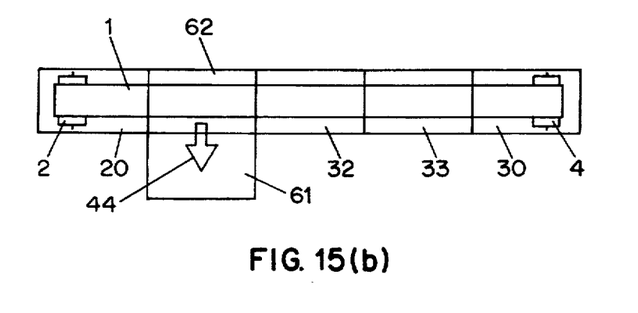
FIGS. 15(b) shows a vertical cross section of the film-forming apparatus shown in FIG. 15(a), along with an illustration of a second step in the film-forming method utilizing the apparatus.
Figure 15C:
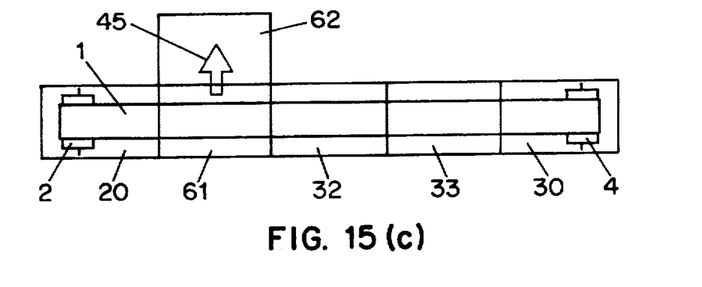
FIGS. 15(c) shows a vertical cross section of the film-forming apparatus shown in FIG. 15(a), along with an illustration of a third step in the film-forming method utilizing the apparatus.
Figure 15D:
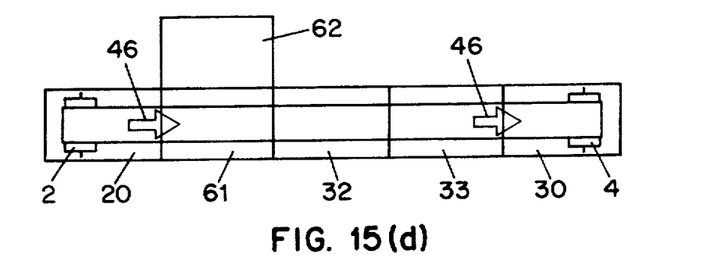
FIGS. 15(d) shows a vertical cross section of the film-forming apparatus shown in FIG. 15(a), along with an illustration of a fourth step in the film-forming method utilizing the apparatus.

To produce the thin-film solar cells shown in FIG. 5 with the apparatus shown in FIGS. 15(a)-15(d), a flexible substrate (1) unrolled from a loading roller (2) in the loading chamber (20) is passed through the movable film-forming chamber (61), as shown in FIG. 15(a), in which chamber (61) a p-layer (21) and a buffer layer (22) are formed under the conditions described above in connection with the production method using the apparatus shown in FIG. 6. Thereafter, the movable film-forming chambers (61) and (62) are moved downward in the direction indicated by the arrow mark (44) such that the film-forming chamber (62) is aligned with the path of the substrate (1), as shown in FIG. 15(b), at which point an i-layer (23) is formed in the chamber (62) under the conditions described above in connection with the apparatus shown in FIG. 6. Next, the movable film-forming chambers (61) and (62) are moved upward in the direction indicated by the arrow mark (45) such that the 15 film-forming chamber (61) returns to the position of the substrate (1), as shown in FIG. 15(c), at which point an n-layer (24), a p-layer (25) and a buffer layer (26) are formed under the conditions described above in connection with the apparatus shown in FIG. 6.

After these operations, the substrate (1) is moved as indicated by the arrow mark (46) to form an i-layer (27) in the i-layer forming chamber (32), and the substrate (1) is then moved to form an n-layer (28) in the n-layer forming chamber (33), as shown in FIG. 15 (d). The bottom i-layer (27) has a thickness as great as 3,000 Å, which takes 20 minutes to form, during which time the layers (21), (22), (24), (25), and (26) can be formed in the film-forming chamber (61), and the i-layer (23) can be formed in the film-forming chamber (62) in 10.1 minutes.

In the movable film-forming chamber (62) of FIGS. 15(a)-15(d), the probability of impurities contaminating the i-layer is minimized because only the i-layer is formed in that particular chamber. In addition, because an intrinsic buffer layer is formed in the movable film-forming chamber (61) each time a series of layers are formed in the chamber (61), the effect of n-type impurities from the walls and electrodes in the chamber is diminished when a p-layer is formed during the next device-forming cycle. Furthermore, because airtightness in the film-forming chambers (61) and (62) could deteriorate when these chambers move, resulting in an influx of air, the loading chamber (20), the film-forming chambers (61), (62), (32) and (33), and the unloading chamber (30) are housed in a collective vacuum chamber (10), which is not shown for sake of simplicity, in order to minimize this possibility.

Figure 16A:
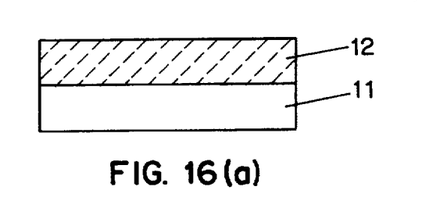
FIG. 16(a) shows a cross section of a flexible substrate of a first type used in conjunction with the embodiments of the present invention.

FIGS. 16(a)-(d) show examples of the flexible substrates used in the aforementioned manufacturing methods and apparatuses. FIG. 16(a) shows a substrate comprised of a transparent conductive film (12) disposed on a transparent resin film (11). The materials used for the transparent resin film (11) may include polyethylene naphthalate, polyethylene terephthalate, polyethylene sulfide, and polyvinyl fluorate. The materials used for the conductive film (12) may include ITO, tin oxide, and zinc oxide. Light beams may be admitted from the side of the substrate in this configuration.

Figure 16B:
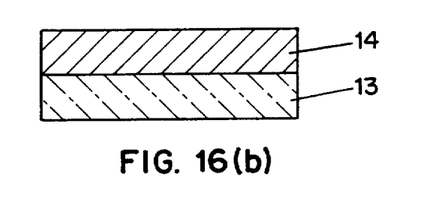
FIG. 16(b) shows a cross section of a flexible substrate of a second type used in conjunction with the embodiments of the present invention.

FIG. 16(b) shows an example of a substrate comprised of a conductive film (14) attached to a resin film (13). Using this substrate requires a configuration in which light beams are admitted from the side of an a-Si based film. On the other hand, this substrate allows materials to be selected with greater degree of freedom without the need to consider transmittance on the resin film (13) and the conductive film (14). For example, using a polyimide-based material for the resin film (13) to improve the heat resistance capability results in improved film quality in an a-Si based film because temperatures can be raised during the film-forming process.

Figure 16C:
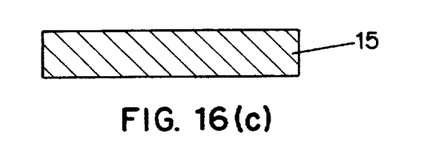
FIG. 16(c) shows a cross section of a flexible substrate of a third type used in conjunction with the embodiments of the present invention.

FIG. 16(c) shows an example of a metal film (15) used for the substrate. This substrate (15) can be a film-formed stainless steel, aluminum, or copper, and can be utilized to make electrodes with high conductivity. In addition, heat resistance and resistance to other environmental factors can be improved.

Figure 16D:
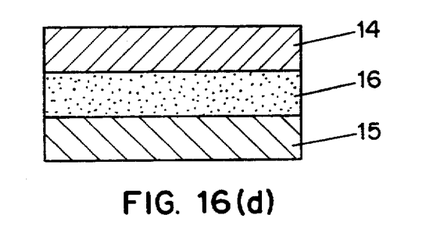
FIG. 16(d) shows a cross section of a flexible substrate of a fourth type used in conjunction with the embodiments of the present invention.

FIG. 16(d) shows an example of a substrate with an insulation film (16) sandwiched between a conductive film (14) and the metal film (15). Although it is impractical to build a series, or multi-layer, structure on one substrate when utilizing the substrate shown in FIG. 16(c), such a structure is possible with the substrate shown in FIG. 16(d) which has an insulation film as part of the substrate. The materials used to make the insulation film may be silicon oxide or other suitable insulators. Similarly, it is possible to build a series, or multi-layer, structure with the substrates shown in FIG. 16(a) and 16(b) if a high-insulation resin is used. Furthermore, because the time required for forming the transparent conductive film (12), the conductive film (14), or the insulation film (16) is less than the time required for forming thin films of a-Si type materials, the substrates shown in FIGS. 16(a)-16(d) can be used with conventional film-forming apparatuses, as well as with the film-forming apparatuses of the present invention.

Figure 17:
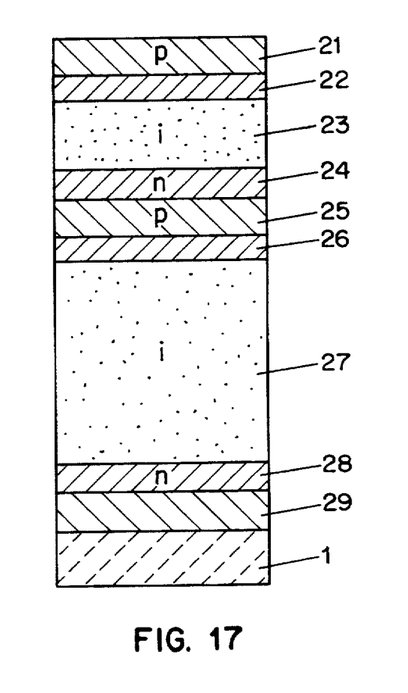
FIG. 17 shows a cross section of a multi-layer solar cell manufactured according to the present invention.

The manufacturing methods or the manufacturing apparatuses according to the present invention may be utilized to construct not only a thin-film solar cell in which light beams can be admitted from the side of the flexible substrate (1), which solar cell structure is shown in FIG. 5, but also to construct a multi-layer, thin-film solar cell shown in FIG. 17. In this structure, each thin-film layer is laminated on top of the flexible substrate (1) and the metal electrode layer (29) in reverse structural sequence to that of the structure shown in FIG. 5.

While the present invention has been described with respect to specific embodiments thereof, it will be appreciated by those of ordinary skill in the art that various modifications and alterations may be made to the described embodiments without departing from the spirit or scope of the invention as defined by the claims.

We claim:

1. An apparatus for manufacturing a photovoltaic conversion device having thin-film layers formed on a belt-shaped flexible substrate, comprising:

a plurality of film-forming chambers through which the flexible substrate, simultaneously passes and within which chambers the thin-film layers are formed;

means for moving the substrate through each film-forming chamber:

means operatively associated with each of the film-forming chambers for introducing reaction-gas mixtures into each of the film-forming chambers;

means for depositing the thin-film layers on the substrate while the substrate remains stationary by transforming the reaction-gas mixtures within the film-forming chambers;

means for sealing the individual film-forming chambers airtight while the substrate remains stationary, said sealing means operatively associated with walls of the individual film-forming chambers and the means for depositing the thin-film layers, said sealing means contacting the substrate while the substrate remains stationary, and said sealing means being removed from the substrate while the substrate is moving; and means for substantially preventing contamination of the reaction-gas mixture in any one of the film-forming chambers and controlling the film-forming conditions of each film-forming chamber independent of the rest of the film-forming chambers.

2. An apparatus for manufacturing a photovoltaic conversion device according to claim 1, wherein the means for moving the substrate through each film-forming chamber comprises two rollers arranged at opposing ends of the apparatus and cooperatively rotating to advance the belt-shaped flexible substrate.

3. An apparatus for manufacturing a photovoltaic conversion device according to claim 2, wherein the sealing means operatively associated with walls of the individual film-forming chambers and the means for depositing the thin-film layers comprises a sealing material attached to the walls of the film-forming chambers.

4. An apparatus for manufacturing a photovoltaic conversion device according to claim 3, wherein the means for depositing the thin-film layers on the substrate comprises at least two electrodes, a first electrode on one side of the flexible substrate, and a second electrode on the opposite side of the electrode, the first electrode being in contact with the substrate surface while a voltage is applied to the two electrodes, and the first electrode being removed from the substrate surface while the substrate is being moved.

5. An apparatus for manufacturing a photovoltaic conversion device according to claim 4, wherein the means for preventing contamination and controlling the film-forming conditions comprises a collective vacuum chamber encompassing the entire apparatus, the vacuum chamber having an exhaust system for controlling the vacuum chamber pressure.

6. An apparatus for manufacturing a photovoltaic conversion device according to claim 4, wherein the means for preventing contamination and controlling the film-forming conditions comprises a preliminary chamber disposed between two immediately adjacent reaction chambers, and a loading chamber and an unloading chamber located at opposing ends of the length of the apparatus, said preliminary chamber, loading chamber and unloading chamber each having means for independently controlling its pressure.

7. An apparatus for manufacturing a photovoltaic conversion device according to claim 6, wherein the means for independently controlling the pressure of each preliminary chamber, loading chamber and unloading chamber comprises an exhaust system connected to each of said preliminary chamber, loading chamber and unloading chamber.

8. An apparatus for manufacturing a photovoltaic conversion device according to claim 4, wherein two of the film-forming chambers are movable in a direction perpendicular to the travelling path of the substrate, a first movable film-forming chamber aligned with the travelling path of the substrate and a second movable film-forming chamber not aligned with the travelling path of the substrate, said second movable film-forming chamber being movable to a position at which it is aligned with the travelling path of the substrate, and said first movable film-forming chamber being out of alignment with the travelling path of the substrate when said second movable chamber is aligned with the travelling path of the substrate.

9. An apparatus for manufacturing a photovoltaic conversion device according to claim 8, wherein the means for preventing contamination and controlling the film-forming conditions comprises a collective vacuum chamber encompassing the entire apparatus, the vacuum chamber having an exhaust system for controlling the vacuum chamber pressure.

10. An apparatus for manufacturing a photovoltaic conversion device according to claim 8, wherein the means for preventing contamination and controlling the film-forming conditions comprises a preliminary chamber disposed between two immediately adjacent reaction chambers, and a loading chamber and an unloading chamber located at opposing ends of the length of the apparatus, said preliminary chamber, loading chamber and unloading chamber each having means for independently controlling its pressure.

11. An apparatus for manufacturing a photovoltaic conversion device according to claim 10, wherein the means for independently controlling the pressure of each preliminary chamber, loading chamber and unloading chamber comprises an exhaust system connected to each of said preliminary chamber, loading chamber and unloading chamber.

12. An apparatus for manufacturing a photovoltaic conversion device according to claim 2, wherein the sealing means operatively associated with walls of the individual film-forming chambers and the means for depositing the thin-film layers comprises a plurality of rollers which simultaneously press against the film-forming chamber walls and the substrate surface.

13. An apparatus for manufacturing a photovoltaic conversion device according to claim 12, wherein the means for depositing the thin-film layers on the substrate comprises at least two electrodes, a first electrode on one side of the flexible substrate, and a second electrode on the opposite side of the electrode, the first electrode being in contact with the substrate surface while a voltage is applied to the two electrodes, and the first electrode being removed from the substrate surface while the substrate is being moved.

14. An apparatus for manufacturing a photovoltaic conversion device according to claim 13, wherein the means for preventing contamination and controlling the film-forming conditions comprises a collective vacuum chamber encompassing the entire apparatus, the vacuum chamber having an exhaust system for controlling the vacuum chamber pressure.

15. An apparatus for manufacturing a photovoltaic conversion device according to claim 13, wherein the means for preventing contamination and controlling the film-forming conditions comprises a preliminary chamber disposed between two immediately adjacent reaction chambers, and a loading chamber and an unloading chamber located at opposing ends of the length of the apparatus, said preliminary chamber, loading chamber and unloading chamber each having means for independently controlling its pressure.

16. An apparatus for manufacturing a photovoltaic conversion device according to claim 13, wherein two of the film-forming chambers are movable in a direction perpendicular to the travelling path of the substrate, a first movable film-forming chamber aligned with the travelling path of the substrate and a second movable film-forming chamber not aligned with the travelling path of the substrate, said second movable film-forming chamber being movable to a position at which it is aligned with the travelling path of the substrate, and said first movable film-forming chamber being out of alignment with the travelling path of the substrate when said second movable chamber is aligned with the travelling path of the substrate.

17. An apparatus for manufacturing a photovoltaic conversion device according to claim 16, wherein the means for preventing contamination and controlling the film-forming conditions comprises a collective vacuum chamber encompassing the entire apparatus, the vacuum chamber having an exhaust system for controlling the vacuum chamber pressure.

18. An apparatus for manufacturing a photovoltaic conversion device according to claim 16, wherein the means for preventing contamination and controlling the film-forming conditions comprises a preliminary chamber disposed between two immediately adjacent reaction chambers, and a loading chamber and an unloading chamber located at opposing ends of the length of the apparatus, said preliminary chamber, loading chamber and unloading chamber each having means for independently controlling its pressure.

19. An apparatus for manufacturing a photovoltaic conversion device according to claim 18, wherein the means for independently controlling the pressure of each preliminary chamber, loading chamber and unloading chamber comprises an exhaust system connected to each of said preliminary chamber, loading chamber and unloading chamber.

* * * * *

UNITED STATES PATENT AND TRADEMARK OFFICE
CERTIFICATE OF CORRECTION

PATENT NO. : 5,364,481

DATED : November 15, 1994

INVENTOR(S) : Sasaki et al.

It is certified that error appears in the above-indentified patent and that said Letters Patent is hereby corrected as shown below:

<u>Column 14, line 39</u>, "substrate, simultaneously passes," should read --substrate simultaneously passes,--;

<u>Column 14, line 51</u>, "means" should read --sealing means--.

Signed and Sealed this

Fourteenth Day of March, 1995

Attest:

BRUCE LEHMAN

*Attesting Officer*     *Commissioner of Patents and Trademarks*